(12) United States Patent
Gaunekar et al.

(10) Patent No.: US 7,305,757 B2
(45) Date of Patent: Dec. 11, 2007

(54) DIE EJECTOR SYSTEM USING LINEAR MOTOR

(75) Inventors: Ajit Gaunekar, Singapore (SG); Gary Peter Widdowson, Hong Kong (HK); Gang Ou, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 458 days.

(21) Appl. No.: 10/801,452

(22) Filed: Mar. 15, 2004

(65) Prior Publication Data

US 2005/0198799 A1    Sep. 15, 2005

(51) Int. Cl.
*B23P 19/00* (2006.01)
(52) U.S. Cl. .............................. 29/740; 29/739; 29/740
(58) Field of Classification Search .................. 29/739, 29/740, 832
See application file for complete search history.

(56) References Cited

U.S. PATENT DOCUMENTS

| 4,234,831 A | * | 11/1980 | Kemmer et al. ............. 318/115 |
| 4,472,668 A | * | 9/1984 | Mutschler et al. ...... 318/568.11 |
| 4,964,211 A | * | 10/1990 | Arao et al. ..................... 29/705 |
| 4,990,051 A | * | 2/1991 | Safabakhsh et al. ......... 156/344 |
| 5,160,877 A | * | 11/1992 | Fujiwara et al. ........ 318/568.21 |
| 5,492,313 A | * | 2/1996 | Pan et al. .................... 267/161 |

\* cited by examiner

*Primary Examiner*—Rick K Chang
(74) *Attorney, Agent, or Firm*—Ostrolenk, Faber, Gerb & Soffen, LLP

(57) ABSTRACT

A die ejector system and method for removing a die from an adhesive surface. The system includes an ejector tool that is operative to move relative to the die whereby to push the die. The ejector tool may consist of a collet holder and an ejector pin array. A shaft holds the ejector tool and is in turn coupled to a forcer of a linear motor. The forcer is movable relative to a stator of the linear motor flexure bearings coupled to the shaft guide movement of the ejector tool relative to the die. After the die is pushed by the ejector tool, a die pick-up device removes the die from the adhesive surface.

11 Claims, 5 Drawing Sheets

DIE EJECTOR SYSTEM USING LINEAR MOTOR

FIELD OF THE INVENTION

The invention relates to a mechanized system for the removal of a bare semiconductor chip or die from an adhesive film on which it is mounted, and in particular to a device for inducing partial delamination of a die from the adhesive film prior to total removal of the die.

BACKGROUND AND PRIOR ART

During a semiconductor packaging process, a plurality of interconnected individual bare semiconductor chips or dice comprised in a wafer are often mounted onto an adhesive film stretched out on a wafer ring for singulation to separate the dice from one another. Mylar film is commonly used as the film with an adhesive surface for mounting the wafer. After singulation, the dice are individually picked up from the adhesive film and placed onto another die, a leadframe, laminate substrate or other carrier depending on the application. For automatically picking up the dice, a die ejection system is used to facilitate effective removal of the dice. In order to avoid the risk of die crack, partial delamination of the die from the adhesive film is advantageous before total removal of the die by a pick-head. The die ejection system thus has die ejector pins to lift a die from an opposite side of the adhesive film from its mounting side to partially delaminate the die from the adhesive film, and thereafter, a pick-head to remove the die totally from the adhesive surface.

Traditionally, die bonding machines use die ejection systems based on some kind of transmission/linkage mechanism used to convert rotational motion of a rotary motor into translational motion used for facilitating ejection of a die. For example, U.S. Pat. No. 5,755,373 for a "Die Push-Up Device" discloses a mechanism including a push-up needle raised and lowered by a cam that is actuated by a rotary motor.

FIG. 1 is a simplified diagram showing various parts of a conventional ejection system in greater detail. The ejection pins 1 are held by a collet 1a, which is mounted at the end of a shaft 2. A roller 15 is affixed to the lower end of the shaft. A rotary motor 20 is used to drive a high precision cam 16, which actuates the shaft 2 through the roller 15 in order to reduce friction. Typically a step-down transmission consisting of a timing belt 18 and pulleys 17, 19 is used to drive the cam 16. Any other suitable transmission mechanism may be used.

FIG. 2 shows the typical operation of ejector pins used to induce partial delamination of dice mounted on an adhesive Mylar sheet. As shown in FIG. 2a, the ejector pins 1 are normally positioned just under a plurality of dice 22 that have been mounted on an adhesive surface of the Mylar sheet 21. This is to allow a wafer table holding the Mylar sheet 21 to execute free indexing motion in the horizontal plane without any obstruction from the pins 1. After the wafer table executes an indexing motion so as to position a die at the pick position on the ejector platform 23, the ejector pins 1 move up as shown in FIG. 2b and at the same time, vacuum force 24 in the direction indicated by dotted arrows is applied from below the Mylar sheet 21. The ejector pins 1 contact the Mylar sheet 21 and lift the die 22 along with the sheet. However, strong vacuum applied from below serves to keep some areas of the Mylar sheet 21 in close contact with the top surface of the ejector platform 23. A rubber seal 25 is provided to concentrate the vacuum around the area of the pick-up position.

In relation to the conventional die ejector system described above, the presence of several components between the drive motor 20 and the end-effector i.e. ejector pin array 1 introduces substantial compliance (reciprocal of stiffness), friction, backlash and hysteresis problems in the system. This reduces the control bandwidth thus severely limits the performance of the ejector system. Secondly, it is difficult to control the impact of the pins on the die during ejection. This could lead to cracking of the die, more so as ever-thinner dies are being introduced into use in the semiconductor industry.

Therefore, it would be desirable to implement a directly driven ejector mechanism for better control of the motion of the ejector pins 1. Moreover, it would also be useful to have a flexure bearing design associated with the directly driven ejector mechanism to improve accuracy and repeatability of the motion.

SUMMARY OF THE INVENTION

It is thus an object of the present invention is to provide an improved die ejector system that avoids some of the aforesaid problems associated with the prior art.

According to a first aspect of the invention, there is provided a die ejector system for removing a die from an adhesive surface, comprising: an ejector tool that is operative to move relative to the die whereby to push the die; a shaft for holding the ejector tool; a linear motor comprising a forcer and a stator, wherein the forcer is coupled to the shaft and is movable relative to the stator; and a die pick-up device for removal of the die from the adhesive surface after the die is pushed by the ejector tool.

According to a second aspect of the invention, there is provided a method for removing a die from an adhesive surface, comprising the steps of: providing an ejector tool that is movable relative to the die; mounting the ejector tool onto a shaft; coupling the shaft to a forcer of a linear motor that is movable relative to a stator of the linear motor; moving the forcer relative to the stator whereby to push the ejector tool against the die; then removing the die from the adhesive surface.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An apparatus and method in accordance with the invention will now be described with reference to the accompanying drawings, which is shown solely by way of a non-limiting demonstrative example of the present invention, in which.

DETAILED DESCRIPTION OF THE PREFERRED EMBODIMENT

Figure 1:
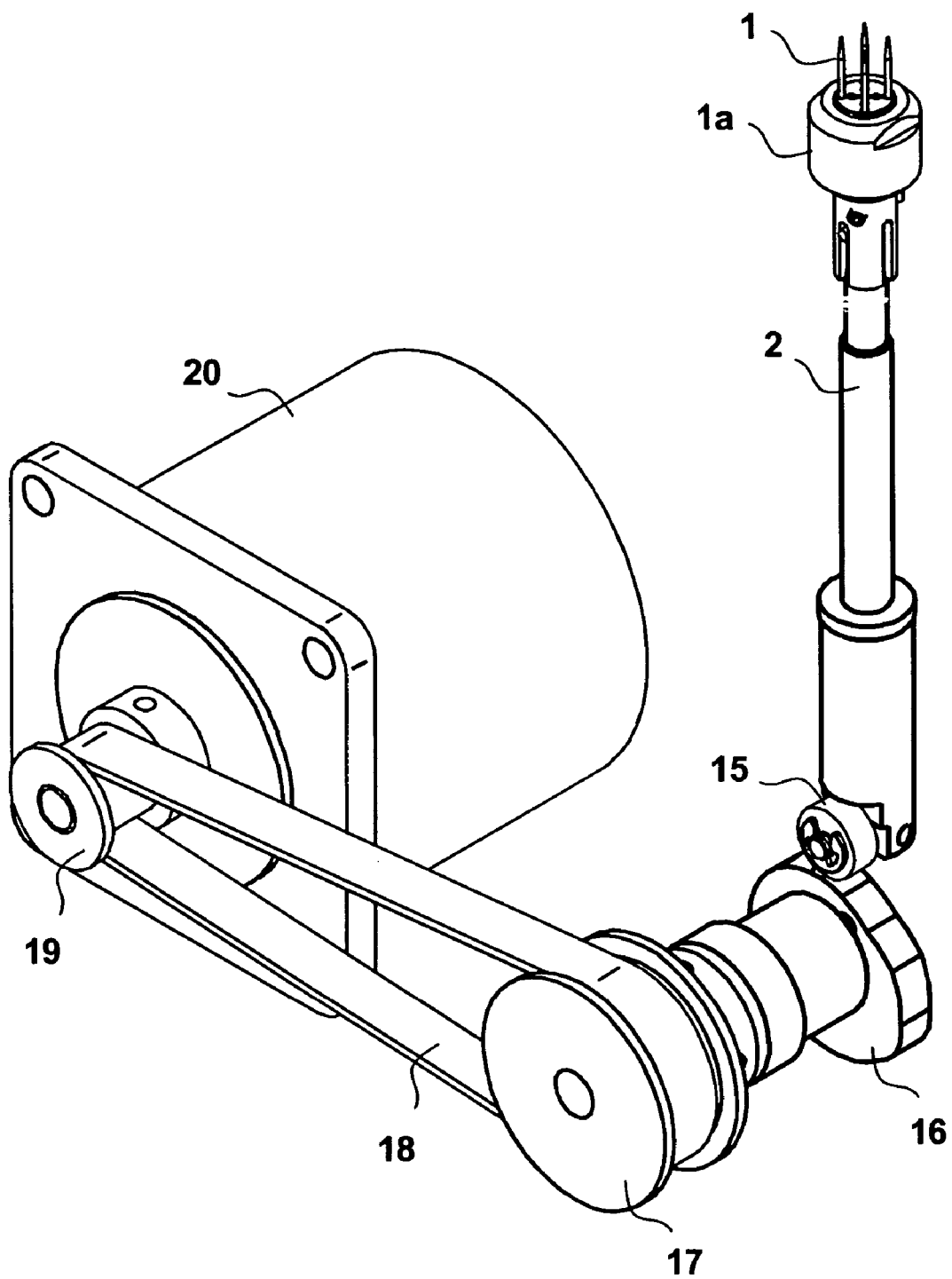
FIG. 1 shows an example of a prior art ejection system wherein a cam-operated ejector system is employed.
Figure 2:
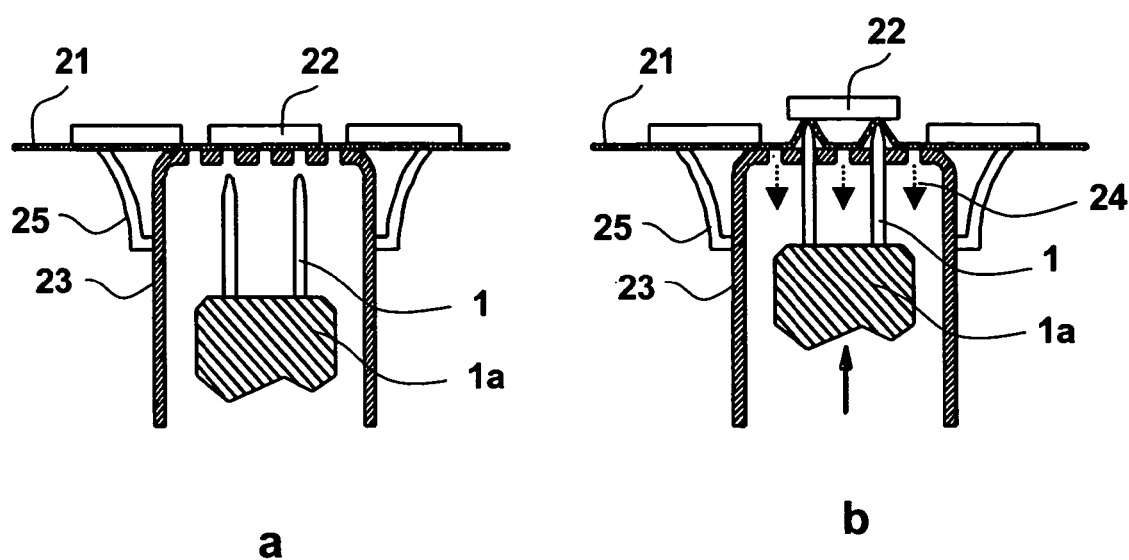
FIG. 2 shows the typical operation of ejector pins used in the partial delamination of a die from a sheet of adhesive film.
Figure 3:
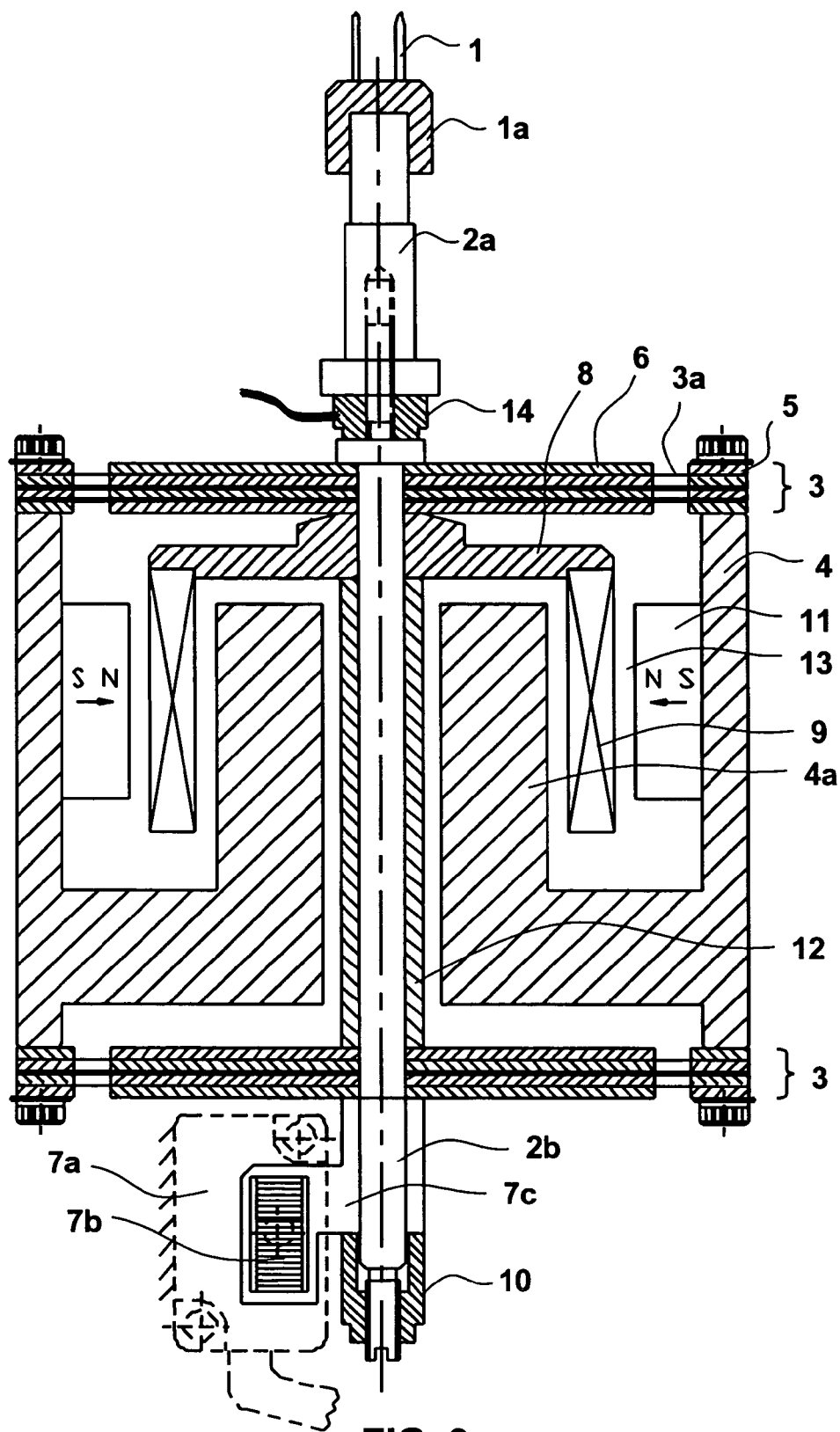
FIG. 3 shows a cross-sectional side view of a preferred embodiment of a die ejector device according to the preferred embodiment of the invention.

The preferred embodiment of the present invention will now be described with reference to the drawings. FIG. 3 shows a cross-sectional side view of the preferred embodiment of a die ejector device according to the invention. The mechanism of the ejector device is intended to achieve straight-line motion of an ejection tool relative to a die whereby to push the die. The moving part of the mechanism is actuated by a voice coil motor in such a way that the effective actuating force is co-axial with a shaft bearing the ejection tool.

The ejector tool comprising a pin array 1 and collet holder 1a is thus affixed and held at an end of a top shaft 2a. Preferably, a force sensor 14 is sandwiched between the top shaft 2a and a bottom shaft 2b for detecting a force exerted by the pin array 1. The bottom shaft 2b, is suspended from a main support 4, using flexure bearings, which may be in the form of flexure stacks 3 comprising flat circular flexure discs, coupled to the bottom shaft 2b. Normally, two sets of flexure stacks 3 separated by a suitable distance are used on the die ejector device. It is also preferable that the two flexure stacks 3 are positioned on opposite sides of the linear motor.

The flexure stacks 3 are spaced apart by a spacer tube 12 and a coil mount 8 of the voice coil 9 in a moving section, and by the main support 4 in a stationary section. An optical encoder 7 including a moving encoder scale 7b is then assembled on the bottom shaft 2a using a scale mount 7c. The whole moving sub-assembly is then clamped tight using a nut 10. A position sensor, for example a stationary encoder read-head 7a, is then aligned appropriately with the encoder scale 7b and coupled to it. Any other type of position sensor, such as a capacitive, inductive or other sensor may be suitably used in place of the optical encoder 7.

A stator of the linear motor, such as radially-magnetized permanent magnets 11, are attached around an inside surface of the main housing 4, such as by using glue. The permanent magnets 11 are preferably made of a high energy density material such as Neodymium Ferrous Boron. With this set-up, a radial magnetic field is created in an annular air gap 13 between the permanent magnets 11 and an inner section 4a of the main housing 4. An axial force is induced on a movable forcer, such as a coil 9 that is adapted to carry a current, when it is appropriately positioned in the magnetic air gap 13 and is energized by an electrical current. When the direction of the current is reversed, the force on the coil 9 is also reversed. The above-described voice coil motor is thus used to directly drive and move the ejector pin array 1. Alternative topologies of a voice coil motor or a multiphase linear motor may be used in place of the voice coil motor described above. Furthermore, using an alternative construction, the movable forcer may comprise permanent magnets whereas the stator may comprise coils adapted to carry current.

The force sensor 14 directly senses the force exerted by the pins 1 on the bottom side of the Mylar sheet 21. The signal from the force sensor 14 may be used to minimize the impact of the pins on the die and also to exert a controlled amount of ejection force as required to partially delaminate a die. Once the die has been sufficiently delaminated to facilitate removal, a die pick-up device (not shown) may hold onto and remove the die from the adhesive surface of the Mylar sheet 21.

FIGS. 4a and 4b show side and plan views respectively of a flexure stack 3. FIGS. 4c to 4e show respectively a flexure 3a, a rim spacer 5 and a central spacer 6 comprised in the flexure stack 3. Each flexure stack 3, comprises one or more flexure discs or flexures 3a, interspersed with spacers in the form of rim spacers 5 and central spacers 6. Each rim spacer 5 is so shaped as to be positionable adjacent to and cover that part of the flexure 3a that is meant to be stationary. It has holes 5a, which are used to mount the flexure stack 3 on the main housing 4. Each central spacer 6 has a hole 6a which mates with the bottom shaft 2b for facilitating mounting thereto. The central spacer 6 is so shaped as to be positionable adjacent to and cover portions of the flexure 3a that move relative to the aforementioned part of the flexure 3a that is meant to be stationary, but do not flex. Flex-arms 3b of the flexure disc 3a are not covered by any of the spacers 5, 6 and can flex to yield the desired axial motion between the portions that move and the parts that are stationary. The mutual coupling of the flex-arms 3b within a flexure 3a, and also within different flexures 3a in the flexure stack 3, imparts a very high radial stiffness to the entire suspended assembly, while keeping the axial stiffness of the flexure stack 3 relatively low.

Figure 5:
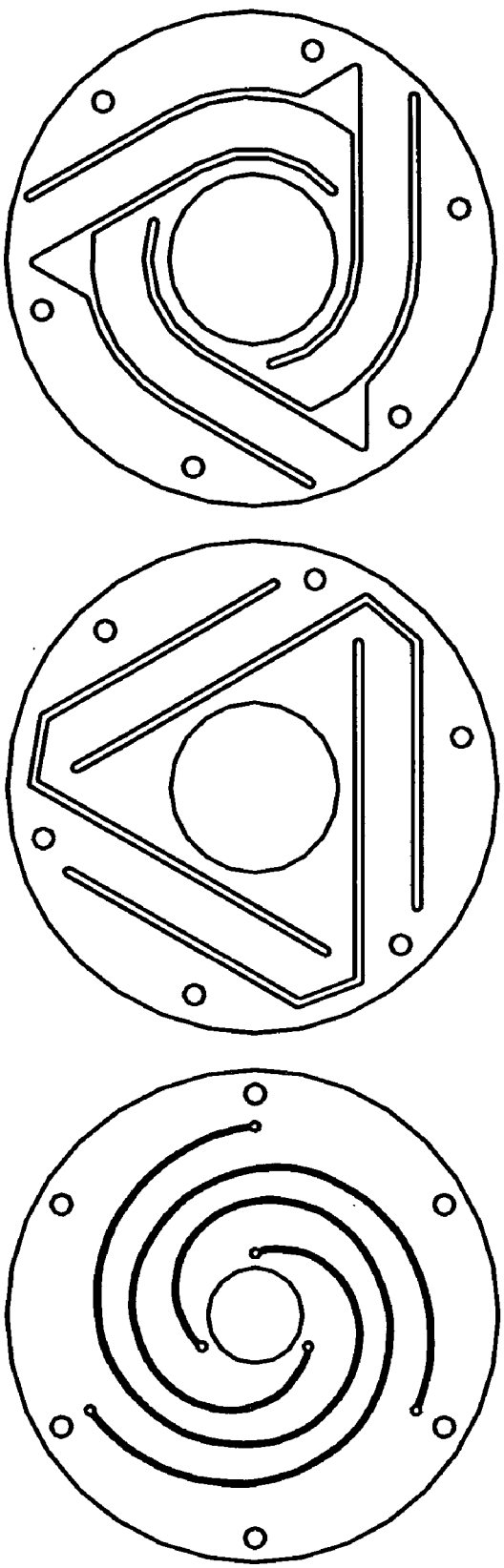
FIG. 5 shows three designs of flexures with polar symmetry.

Flexures 3a are especially suitable for guiding movement of the ejector pins 1 due to the excellent inherent repeatability and smoothness of their motion trajectory while avoiding friction and wear that are associated with conventional bearings. Some typical flexure designs are shown in FIG. 5. The flexure designs may be in the form of flat discs that are fractions of a millimeter thick. Each disc has a specified number of slots (usually but not always, three), and can have spiral, straight or arc shapes or a combination thereof. They are preferably regularly-shaped and machined using either wire Electro-Discharge Machining, photo-lithography or any other suitable method for yielding a number of flexing "arms" which bear the load of a moving member. Very high ratios of radial stiffness to axial stiffness can be realized using such flexures.

Figure 4:
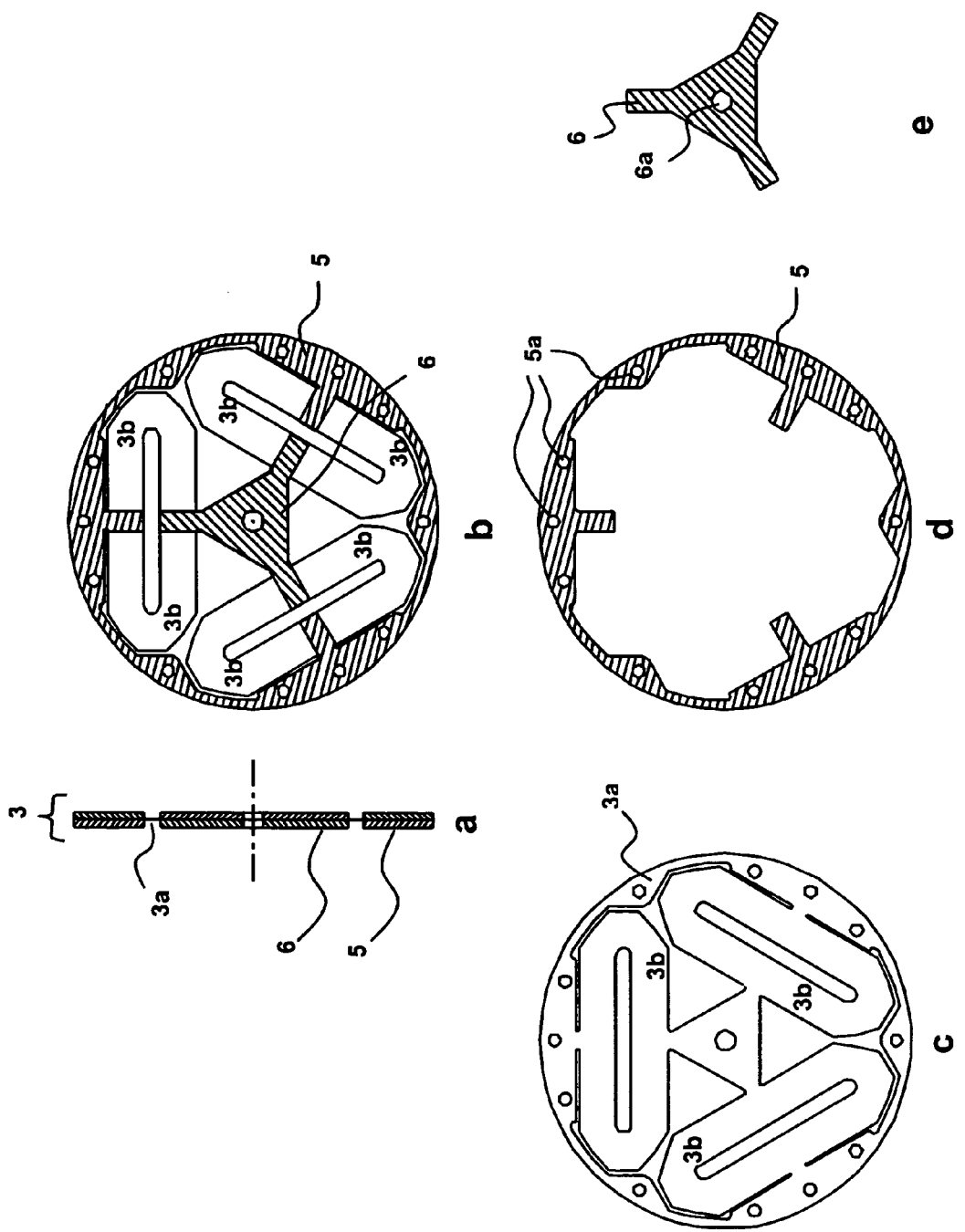
FIGS. 4a and 4b show side and plan views respectively of a flexure stack, whilst
FIGS. 4c to 4e show respectively a flexure, a rim spacer and a central spacer comprised in the flexure stack.

Flexures with polar symmetry such as those shown in FIG. 5 suffer from a small parasitic rotation about the motion axis. Such flexures have been used in long life compressors and cryogenic coolers, for example, as disclosed in U.S. Pat. No. 5,351,490. Since even such a small parasitic rotation cannot be tolerated in the present application, it is preferable to design and use flexures without any parasitic motion whatsoever. The preferred embodiment of a flexure disc shown in FIG. 4 is free of a net parasitic motion.

Actuation of the die ejector mechanism using flexures of circular symmetry is preferably implemented by incorporating a brushless linear motor using permanent magnets. The linear motor could be either of single phase (commonly called a voice coil motor) or of multiphase design, in any of the several possible topologies but most are usually cylindrical. In order to make best use of the available space to obtain a compact design, the cylindrical voice coil motor keeps the actuating force or pushing force virtually aligned with the axis of the flexure discs along which the flexure discs are adapted to flex. The position sensor provides position feedback enabling the motor to be operated in closed loop servo mode for very precise control over the axial position of the ejector pin array mounted on the moving shaft.

The invention described herein is susceptible to variations, modifications and/or additions other than those specifically described and it is to be understood that the invention includes all such variations, modifications and/or additions which fall within the spirit and scope of the above description.

The invention claimed is:

1. A die ejector system for removing a die from an adhesive surface, comprising:
    an ejector tool that is operative to move relative to a position at which a die on an adhesive surface is located, whereby to push the die;
    a shaft for holding the ejector tool;
    a linear motor comprising a forcer and a stator, wherein the forcer is coupled to the shaft and is movable relative to the stator and wherein the linear motor includes two opposite ends, a first end being below the forcer and the stator and a second end being above the forcer and the stator;
    a flexure bearing coupled to the shaft for guiding movement of the ejector tool relative to the position at which the die is located the flexure bearing being positioned at the first end of the linear motor;
    a second flexure bearing coupled to the shaft, the second flexure bearing being positioned at the second end of the linear motor; and
    a die pick-up device for removal of a die from the adhesive surface at the die position which has been pushed by the ejector tool.

2. A die ejector system as claimed in claim 1, wherein the forcer comprises coils adapted to carry current.

3. A die ejector system as claimed in claim 1, wherein the stator comprises permanent magnets.

4. A die ejector system as claimed in claim 1, wherein an axis of a pushing force generated on the shaft is aligned with an axis along which the flexure bearing is adapted to flex.

5. A die ejector system as claimed in claim 1, wherein the flexure bearing comprises flexing portions for facilitating relative axial motion of non-flexing portions of the flexure bearing.

6. A die ejector system as claimed in claim 5, wherein the flexure bearing includes spacers positioned adjacent and covering at least part of the non-flexing portions for facilitating mounting of the non-flexing portions to one or more mounting surfaces.

7. A die ejector system as claimed in claim 1, wherein the flexure bearing comprises a flexible disc.

8. A die ejector system as claimed in claim 1, including regularly-shaped slots fabricated on the flexure bearing with polar symmetry.

9. A die ejector system as claimed in claim 1, wherein the linear motor is cylindrically-shaped.

10. A die ejector system as claimed in claim 1, including a force sensor coupled to the shaft for detecting a force exerted on the ejector tool.

11. A die ejector system as claimed in claim 1, including a position sensor coupled to the shaft for providing position feedback whereby to determine a position of the ejector tool.

* * * * *